(12) United States Patent
Yeh

(10) Patent No.: US 6,297,722 B1
(45) Date of Patent: Oct. 2, 2001

(54) SURFACE MOUNTABLE ELECTRICAL DEVICE

(75) Inventor: Ching-Chiang Yeh, Taipei Hsien (TW)

(73) Assignee: Fuzetec Technology Co., Ltd., Hsin-Chuang (TW)

( * ) Notice: Subject to any disclaimer, the term of this patent is extended or adjusted under 35 U.S.C. 154(b) by 0 days.

(21) Appl. No.: 09/662,978

(22) Filed: Sep. 15, 2000

(51) Int. Cl.$^7$ ..................................................... H01C 7/10
(52) U.S. Cl. ........................... 338/22 R; 29/874; 29/612; 338/203; 338/313
(58) Field of Search .................. 338/22 R, 307, 338/309, 312, 313, 314, 203; 29/619, 621, 874, 612

(56) References Cited

U.S. PATENT DOCUMENTS

| | | | |
|---|---|---|---|
| 5,334,968 | * | 8/1994 | Negoro ................................. 338/320 |
| 5,572,779 | * | 11/1996 | Adelman et al. .................... 29/25.42 |
| 5,864,281 | * | 1/1999 | Zhang et al. ........................ 338/22 R |
| 5,884,391 | * | 3/1999 | McGuire et al. ....................... 29/612 |
| 6,023,403 | * | 2/2000 | McGuire et al. ..................... 361/106 |

FOREIGN PATENT DOCUMENTS 4-357801 * 12/1992 (JP) .

* cited by examiner

Primary Examiner—Karl D. Easthom
Assistant Examiner—Richard K. Lee
(74) Attorney, Agent, or Firm—Merchanat & Gould P.C.

(57) ABSTRACT

A process for manufacturing surface mountable electrical devices includes the steps of preparing a PTC resistive plate, covering the plate with first and second conductive layers to form a laminate, forming a plurality of spaced apart bores of cross-shaped cross-section in the laminate along intersecting cutting lines at locations where the cutting lines intersect, electroplating the first and second conductive layers and the cross-shaped bores, and cutting the laminate along the cutting lines to form a plurality of polygonal elements with each of the bores being divided into four parts, each having a substantially L-shaped cross-section.

4 Claims, 5 Drawing Sheets

SURFACE MOUNTABLE ELECTRICAL DEVICE

BACKGROUND OF THE INVENTION

1. Field of the Invention

This invention relates to a surface mountable electrical device, more particularly to a surface mountable electrical device that can serve as a circuit protection device, such as a fuse.

2. Description of the Related Art

FIG. 1 illustrates a conventional circuit protection device 10 disclosed in U.S. Pat. No. 5,852,397. The device 10 is prepared from a laminate having an array of drilled apertures. The laminate is cut into a plurality of the devices along intersecting cutting lines in two directions. The apertures are located at positions where the cutting lines intersect. The device 10 includes a planar PTC (positive temperature coefficient) resistive element 11 having opposite first and second surfaces 111, 112 and four apertures 113 of quarter circular cross-section that run between the first and second surfaces 111, 112 at four corners of the PTC resistive element 11, first and second electrode layers 12, 13 respectively covering portions of the first and second surfaces 111, 112, third and fourth electrode layers 14, 15 respectively covering other portions of the first and second surfaces 111, 112 and spaced apart from the first and second electrode layers 12, 13, a first plating layer 16 having first and second portions 161, 162 respective covering the first and fourth electrode layers 12, 15 and two spaced apart first transverse portions 163 extending between the first and second portions 161, 162 within two of the apertures 113 that are adjacent to the fourth electrode layer 15, and a second conductive layer 17 having third and fourth portions 171, 172 respectively covering the second and third electrode layers 13, 14 and two second transverse portions 173 extending between the third and fourth portions 171, 172 within another two of the apertures 113 that are adjacent to the third electrode layer 14. The first and second transverse portions 163, 173 have a quarter circular cross-section corresponding to those of the apertures 113. Aside from being formed at the corners of the PTC resistive element 11 and having quarter cross-sections, the aforesaid apertures 113 can be formed at any other positions in the PTC resistive element 11, and can have a closed cross-section, such as a circular, an oval, or a rectangular shape, or a reentrant cross-section that denotes an open cross-section which has a depth at least 0.15 times the maximum width thereof and which has at least one part where the opposite edges of the cross section are parallel to each other in order to ensure that the first and second transverse portions 163, 173 of the first and second plating layers 16, 17 will not be damaged or dislodged during installation or use of the device 10. However, since the maximum width of each aperture 113 is very small, which is normally designed to be within a range of 0.2 to 0.5 mm, there is a tendency for the first and second transverse portions 163, 173 of the first and second plating layers 16, 17 to be damaged or dislodged during the process of cutting the laminate to form the devices 10 with apertures of reentrant cross-sections, and there is a need for a relatively high accuracy in the aforementioned cutting lines.

SUMMARY OF THE INVENTION

Therefore, the object of the present invention is to provide a process for manufacturing surface mountable electrical devices that is capable of overcoming the aforementioned drawbacks.

According to the present invention, a process for manufacturing surface mountable electrical devices comprises the steps of: preparing a PTC resistive plate having first and second opposite surfaces; respectively covering the first and second opposite surfaces with first and second conductive layers to form a laminate; forming a plurality of spaced apart bores of cross-shaped cross-section in the laminate along intersecting cutting lines at locations where the cutting lines intersect; electroplating the first and second conductive layers and the cross-shaped bores; and cutting the laminate along the cutting lines to form a plurality of polygonal elements with each of the bores being divided into four parts, each having a substantially L-shaped cross-section.

BRIEF DESCRIPTION OF THE DRAWINGS

In drawings which illustrate an embodiment of the invention.

DETAILED DESCRIPTION OF THE PREFERRED EMBODIMENT

Figure 1:
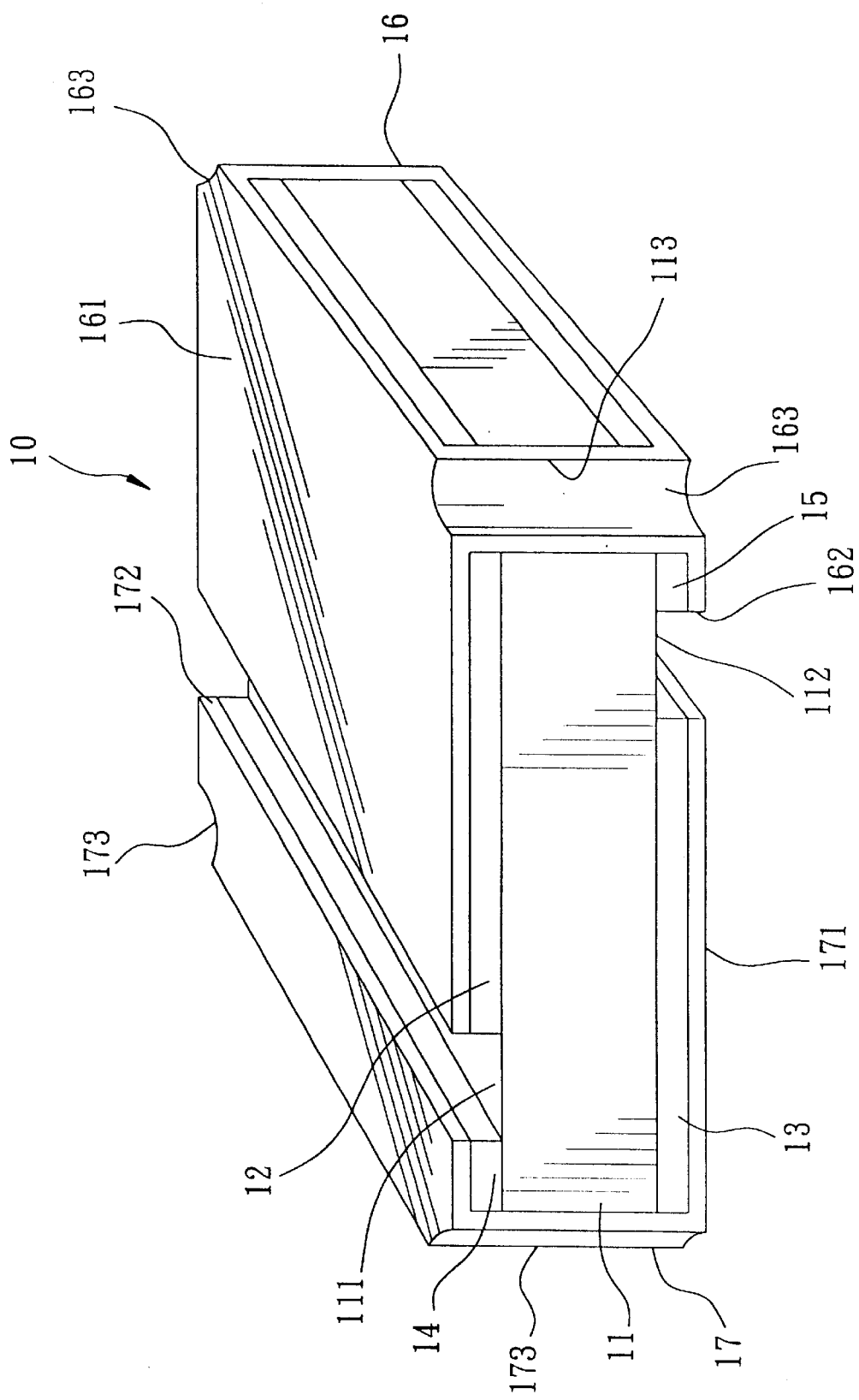
FIG. 1 is a perspective view of a conventional circuit protection device.
Figure 2:
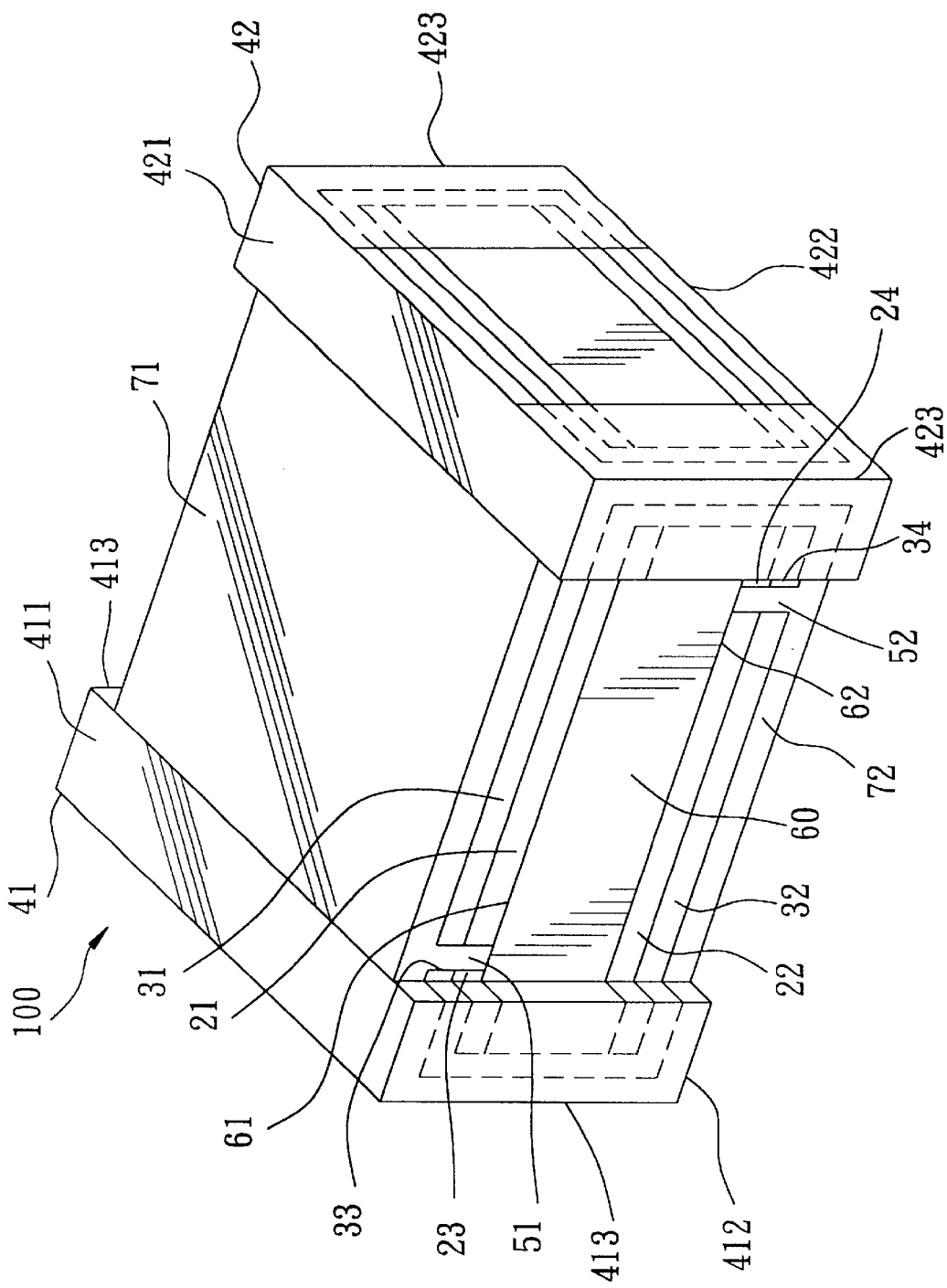
FIG. 2 is a perspective view of a surface mountable electrical device prepared by a process embodying this invention.
Figure 3:
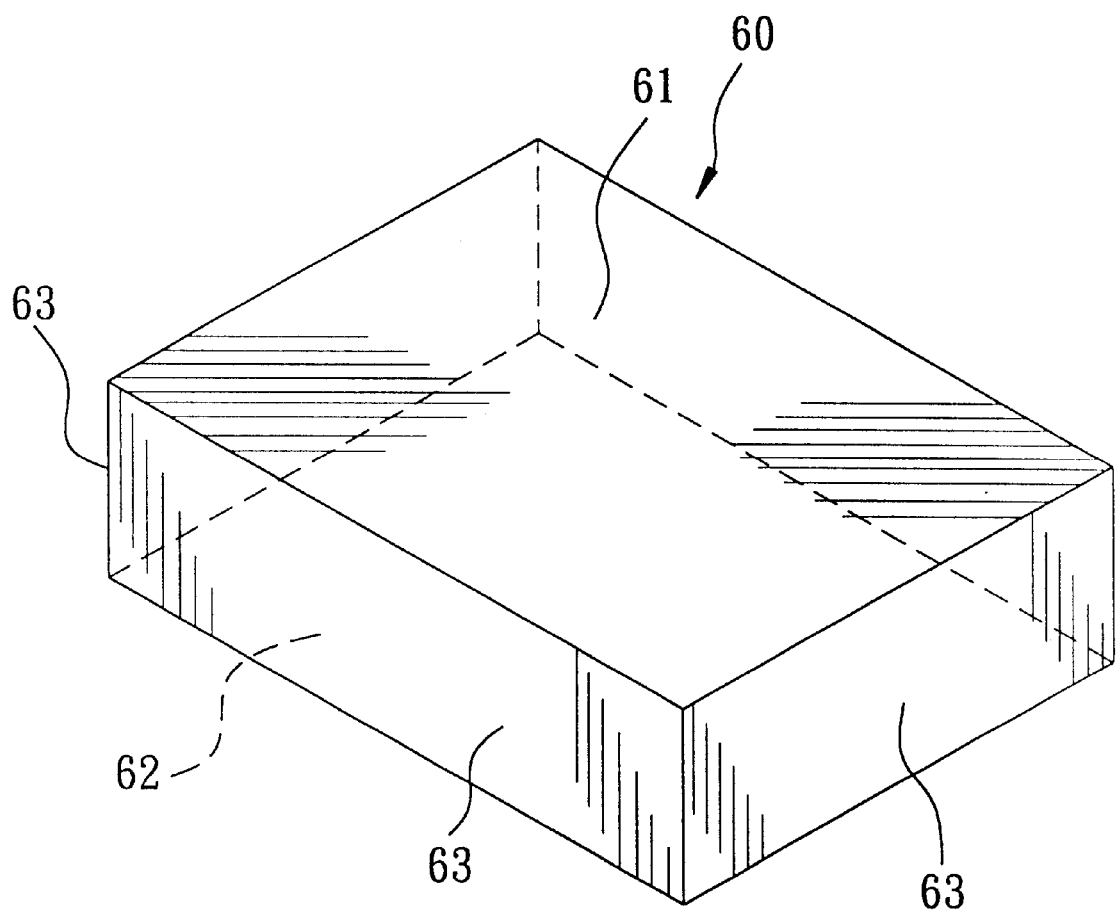
FIG. 3 is a perspective view of a PTC resistive element of the device of FIG. 2.

FIGS. 2 and 3 illustrate a surface mountable electrical device 100 prepared by a process embodying this invention. The device 100 includes a planar PTC resistive element 60 having opposite first and second surfaces 61, 62 and a plurality of planar lateral faces 63 interconnecting the first and second surfaces 61, 62, first and second electrode layers 21, 22 formed respectively on the first and second surfaces 61, 62, third and fourth electrode layers 23, 24 respectively formed on the first and second surfaces 61, 62 and spaced apart from the first and second electrode layers 21, 22, first and second inner conductive layers 31, 32 respectively covering the first and second electrode layers 21, 22, third and fourth inner conductive layers 33, 34 respectively covering the third and fourth electrode layers 23, 24, and first and second outer conductive layers 41, 42 respectively disposed at two opposite ends of assembly of the PTC resistive element 60 and the first, second, third, and fourth electrode layers 21, 22, 23, 24.

The first outer conductive layer 41 includes a first segment 411 covering an end portion of the third inner conductive layer 33, a second segment 412 opposite to the first segment 411 and covering a portion of the second inner conductive layer 32, and a pair of transverse segments 413 respectively disposed at two corners of one of two opposite ends of the PTC resistive element 60, each of which is defined by two adjacent ones of the planar lateral faces 63 of the PTC resistive element 60. The transverse segments 413 extend between the first and second segments 411, 412, and interconnect the second and third inner conductive layers 32, 33 and the second and third electrode layers 22, 23.

The second outer conductive layer 42 includes a first segment 421 covering an end portion of the first inner conductive layer 31, a second segment 422 opposite to the first segment 421 and covering a portion of the fourth inner conductive layer 34, and a pair of transverse segments 423 respectively disposed at two corners of the other one of two opposite ends of the PTC resistive element 60, each of which is defined by two adjacent ones of the planar lateral faces 63 of the PTC resistive element 60. The transverse segments 423 extend between the first and second segments 421, 422, and interconnect the first and fourth inner conductive layers 31, 34 and the first and fourth electrode layers 21, 24. The cross-section of each of the transverse segments 413, 423 of the first and second outer conductive layers 41, 42 is substantially L-shaped and defines a right angle, and respectively corresponds to that of the respective corner of the PTC resistive element 60. The first electrode layer 21 and the first inner conductive layer 31 are spaced apart from the third electrode layer 23 and the third inner conductive layer 33 by a first gap 51. The second electrode layer 22 and the second inner conductive layer 32 are spaced apart from the fourth electrode layer 24 and the fourth inner conductive layer 34 by a second gap 52.

The first segments 411, 421 of the first and second outer conductive layers 41, 42 cooperate with the third inner conductive layer 33 and the first inner conductive layer 31 to define a substantially U-shaped first recess that is communicated with the first gap 51. The second segments 412, 422 of the first and second outer conductive layers 41, 42 cooperate with the second inner conductive layer 32 and the fourth inner conductive layer 34 to define a substantially U-shaped second recess that is communicated with the second gap 52. First and second insulative layers 71, 72 are respectively disposed in the first and second recesses, and extend into the first and second gaps 51, 52.

Figure 4:
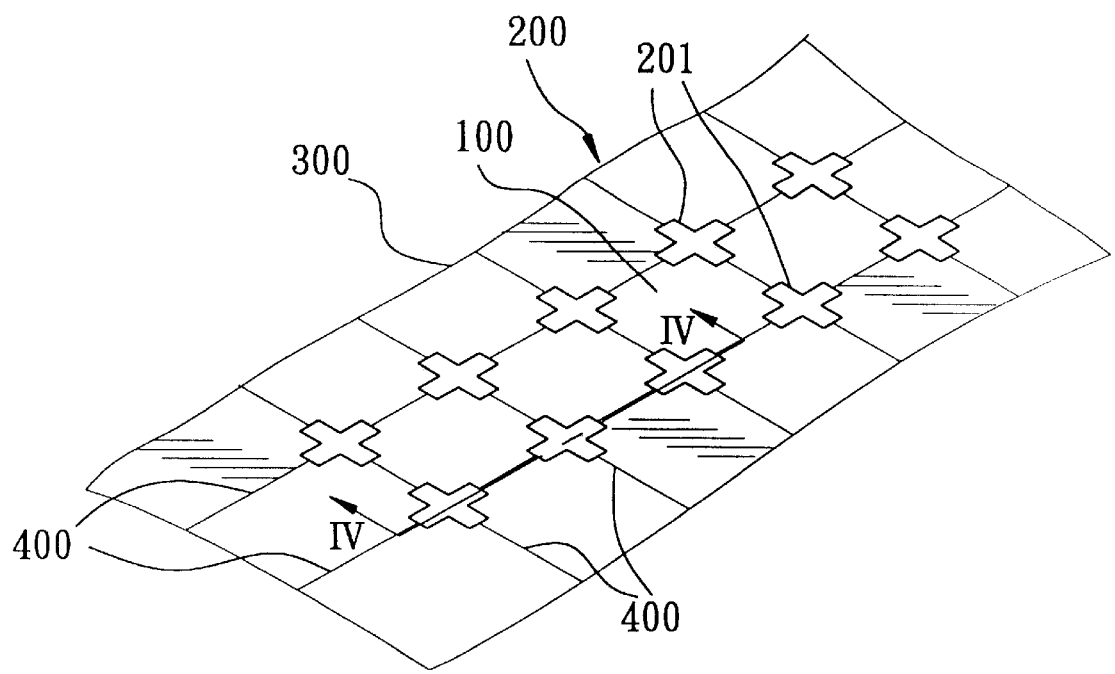
FIG. 4 is a top view to illustrate a laminate with an array of bores of cross-shaped cross-sections that are cut along cutting lines to form a plurality of the devices of FIG. 2.
Figure 5:
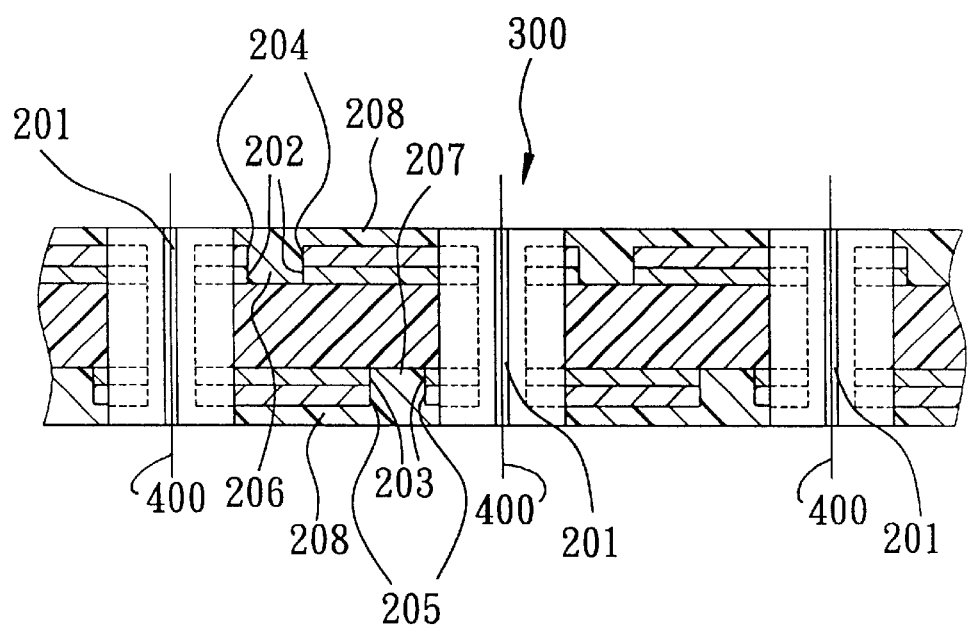
FIG. 5 is a cross-sectional side view taken along line IV—IV from FIG. 4.
Figure 6:
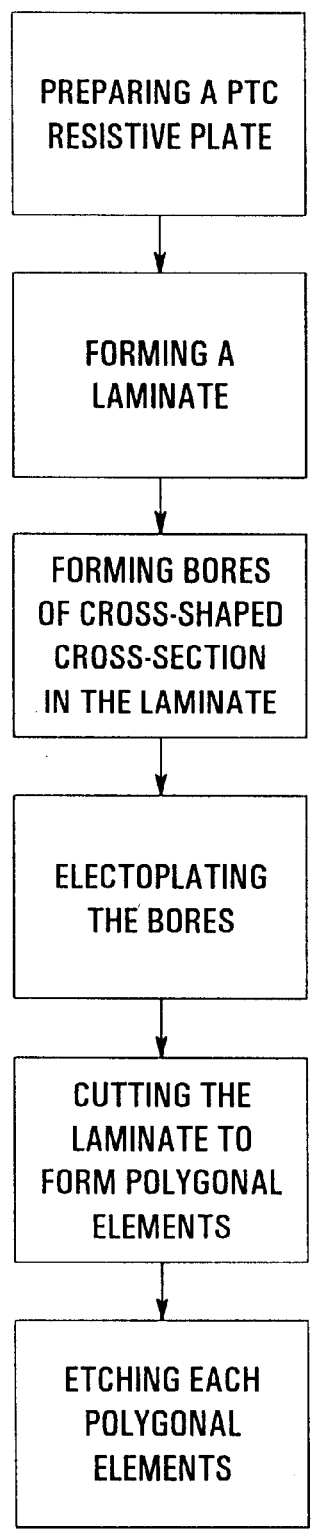
FIG. 6 is a flow diagram of process for manufacturing surface mountable electrical devices.

Referring now to FIGS. 4 and 5, in combination with FIGS. 2 and 3, the process for manufacturing the surface mountable electrical device 100 includes the steps of preparing a PTC resistive plate 300 having first and second opposite surfaces, respectively covering the first and second opposite surfaces with first and second metal foil layers 202, 203, respectively covering the first and second metal layers 202, 203 with first and second conductive layers 204, 205 to form a laminate of the PTC resistive plate 300, the first and second metal layers 202, 203 and the first and second conductive layers 204, 205, forming first and second gaps 206, 207 in the laminate by etching to separate each of the first and second metal layers 202, 203 and the first and second conductive layers 204, 205 into two separate segments and to form the first, second, third and fourth electrode layers 21, 22, 23, 24 and the first, second, third and fourth inner conductive layers 31, 32, 33, 34, covering the first and second conductive layers 204, 205 and the first and second gaps 206, 207 with an insulative material 208 to form the first and second insulative layers 71, 72, forming a plurality of spaced apart bores 201 of cross-shaped cross-section in the laminate along intersecting cutting lines 400 at locations where the cutting lines 400 intersect, electroplating the first and second conductive layers 204, 205 and the cross-shaped bores 201 to form the first and second outer conductive layers 41, 42, and cutting the laminate along the cutting lines 400 to form a plurality of polygonal surface mountable electrical devices 100 with each of the bores 201 being divided into four parts, each of which has a substantially L-shaped cross-section that corresponds to that of a respective corner of the thus formed device 100. The formation of each of the bores 201 can be carried out by punching, by routing, or by successively drilling a plurality of through-holes one after the other in two directions along the cutting lines in an overlapping manner.

In a preferred embodiment, the PTC resistive plate 300 is composed of a polymer component, such as Polyethylene or polyethylene derivatives, and a conductive filler component, such as carbon black.

The first and second metal layers 202, 203 are preferably metal foils comprising a metal selected from a group consisting of nickel, copper, silver, tin, gold and alloys thereof.

The first and second conductive layers 204, 205 may be comprised of any conductive material, but preferably comprises a metal selected from the group consisting of copper, tin, silver, nickel, gold and alloys thereof.

The first and second outer conductive layers 41, 42 are preferably a solder material which allows the surface mountable device 100 to be easily connected to conductive terminals of a printed circuit board and which is preferably tin soldering material.

With the design of the L-shaped transverse segments 413, 423 of the first and second outer conductive layers 41, 42, the tendency for the transverse segments 413, 423 to be damaged or dislodged during the process of cutting as encountered in the prior art is significantly abated. Moreover, the process of this invention requires less accuracy in the cutting lines 400 as compared to the process of the prior art.

With the invention thus explained, it is apparent that various modifications and variations can be made without departing from the spirit of the present invention. It is therefore intended that the invention be limited only as recited in the appended claims.

I claim:

1. A process for manufacturing surface mountable electrical devices, comprising the steps of:

preparing a PTC resistive plate having opposite first and second surfaces;

respectively covering said first and second surfaces with first and second conductive layers to form a laminate;

forming a plurality of spaced apart bores of cross-shaped cross-section in said laminate along intersecting cutting lines at locations where said cutting lines intersect;

electroplating said first and second conductive layers and said cross-shaped bores; and cutting said laminate along said cutting lines to form a plurality of polygonal elements with each of said bores being divided into four parts, each having a L-shaped cross-section.

2. The process of claim 1, wherein each of said bores is formed in said laminate by punching.

3. The process of claim 1, wherein each of said bores is formed in said laminate by successively forming a plurality of through-holes one after the other in two directions along said cutting lines in an overlapping manner.

4. The process of claim 1, further comprising the step of dividing at least one of said first and second conductive layers by etching so that at least one of said first and second metal layers, covering each of said polygonal elements formed after cutting, is divided into two segments by a separation line.

* * * * *

UNITED STATES PATENT AND TRADEMARK OFFICE
CERTIFICATE OF CORRECTION

PATENT NO. : 6,297,722 B1
DATED : October 2, 2001
INVENTOR(S) : Yeh et al.

It is certified that error appears in the above-identified patent and that said Letters Patent is hereby corrected as shown below:

<u>Title page,</u>
Item [12], United States Patent, "Yeh" should read -- Yeh et al. --
Item [75], Inventor, add -- Jack Jih-Sang Chen, Taipei City (TW); Chun-Ta Tseng, Taipei Hsien (TW) --

Signed and Sealed this

Twentieth Day of August, 2002

*Attest:*

*Attesting Officer*

JAMES E. ROGAN
*Director of the United States Patent and Trademark Office*